United States Patent
Kume

(10) Patent No.: US 8,593,185 B2
(45) Date of Patent: Nov. 26, 2013

(54) CLOCK DIVIDER CIRCUIT AND SYSTEM LSI HAVING SAME

(75) Inventor: Takayuki Kume, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 160 days.

(21) Appl. No.: 13/168,378

(22) Filed: Jun. 24, 2011

(65) Prior Publication Data

US 2012/0001664 A1 Jan. 5, 2012

(30) Foreign Application Priority Data

Jul. 1, 2010 (JP) ................................. 2010-150929

(51) Int. Cl.
*H03K 21/00* (2006.01)

(52) U.S. Cl.
USPC ............................ 327/115; 327/117; 713/500

(58) Field of Classification Search
USPC .............. 327/113–115, 117, 118; 377/47, 48; 713/322, 500, 501, 503
See application file for complete search history.

(56) References Cited

U.S. PATENT DOCUMENTS

| 5,778,237 | A | 7/1998 | Yamamoto et al. |
| 7,501,868 | B2 * | 3/2009 | Ito ................................. 327/158 |
| 2003/0163743 | A1 | 8/2003 | Endo |
| 2011/0133793 | A1 * | 6/2011 | Wheelock et al. ............ 327/115 |

FOREIGN PATENT DOCUMENTS

| JP | 56-014758 A | 2/1981 |
| JP | 63-070321 A | 3/1988 |
| JP | 02-202609 A | 8/1990 |
| JP | 7-287699 A | 10/1995 |
| JP | 08-211960 | 8/1996 |
| JP | 2003-248524 A | 9/2003 |
| JP | 2006-202172 A | 8/2006 |
| JP | 2006-318002 A | 11/2006 |
| JP | 2007-259125 A | 10/2007 |

OTHER PUBLICATIONS

Japanese Office Action from Japanese Patent Application 2010-150929, Notification of Reason for Rejection, dated Oct. 4, 2013, 5 pages.

* cited by examiner

*Primary Examiner* — Patrick O'Neill
(74) *Attorney, Agent, or Firm* — Arent Fox LLP

(57) ABSTRACT

A clock divider circuit has a plurality of dividers for which dividing ratios are settable, a preset register group that stores the dividing ratios set for the plurality of dividers, and a selector that selects a single preset register within the preset register group, and imparts the dividing ratios stored in the selected preset register to the plurality of dividers.

9 Claims, 7 Drawing Sheets

CLOCK DIVIDER CIRCUIT AND SYSTEM LSI HAVING SAME

CROSS-REFERENCE TO RELATED APPLICATION

This application is based upon and claims the benefit of priority of the prior Japanese Patent Application No. 2010-150929, filed on Jul. 1, 2010, the entire contents of which are incorporated herein by reference.

FIELD

The present invention relates to a clock divider circuit that divides a clock frequency and a system LSI having the same.

BACKGROUND

A clock divider circuit generates a clock of a desired frequency by dividing a frequency of a reference clock with a divider corresponding to a dividing ratio set in a register (refer to, for example, Japanese Laid-open Patent Publication Nos. 2003-248524, 2007-259125, 56-14758, 63-70321 and 2-202609). Power consumption of a system is minimized by switching the frequency of a clock by rewriting a register corresponding to an operating mode of the system. For example, when a plurality of circuit blocks within a system respectively use a plurality of clocks having different frequencies, the frequency of the clock supplied to each circuit block is changed by setting the register that determines the dividing ratio of the corresponding divider.

However, when switching frequencies of a plurality of clocks, since it is necessary to sequentially rewrite the corresponding registers, it takes time for rewriting of the clock frequencies to be completed. Since the circuit blocks do not operate until the clocks are switched, system performance ends up decreasing.

SUMMARY

In one aspect of the present invention, a clock divider circuit has: a plurality of dividers that are able to set clock dividing ratios; a preset register group that stores the dividing ratios set for the plurality of dividers; and a selector that selects a single preset register within the preset register group and provides the dividing ratios stored in the selected preset register to the plurality of dividers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
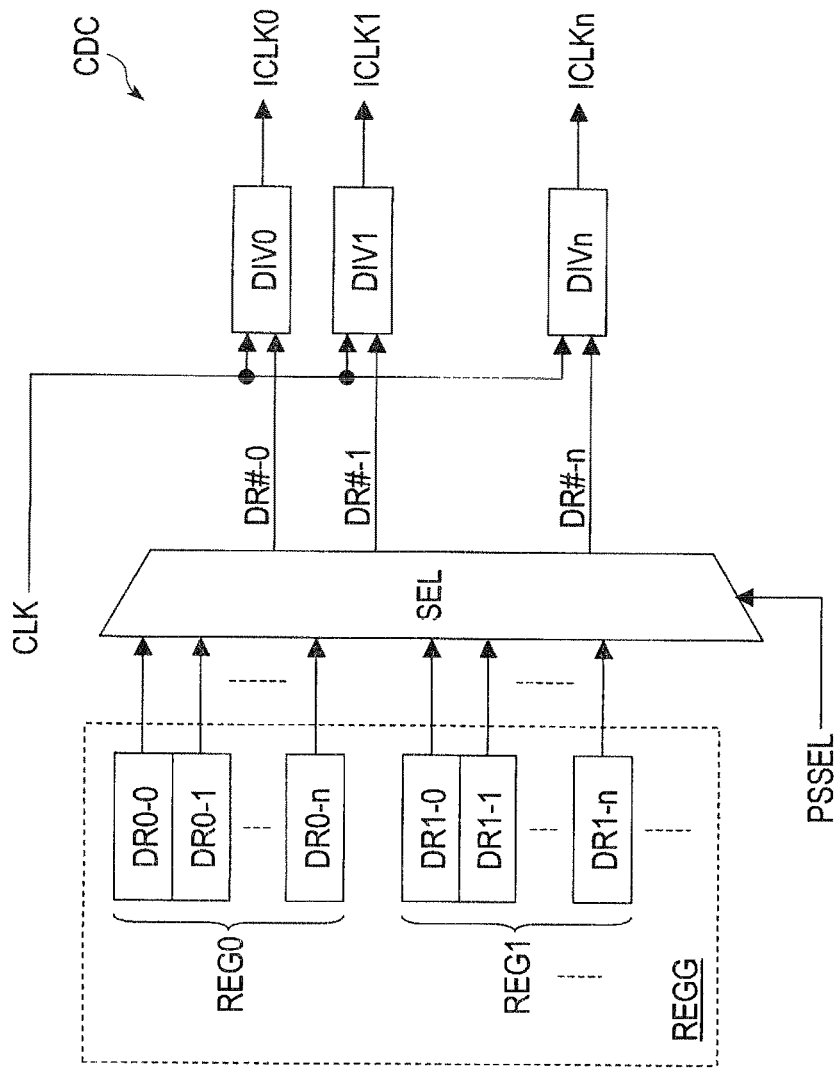
FIG. 1 is a drawing of a clock divider circuit CDC in one embodiment.

The following provides an explanation of embodiments using the drawings. In the drawings, signal lines indicated with thick lines are composed with a plurality of lines. In addition, a portion of blocks connected by thick lines are composed with a plurality of circuits. The same reference symbols as the signal names are used for those signal lines to which signals are transmitted.

FIG. 1 is a drawing of a clock divider circuit CDC in one embodiment. For example, the clock divider circuit CDC is embodied in a semiconductor integrated circuit along with a plurality of circuit blocks (not shown) that operate synchronously to a plurality of clocks ICLK (ICLK0, ICLK1, ..., ICLKn) having different frequencies. The clock divider circuit CDC has a preset register group REGG having a plurality of preset registers REG (REG0, REG1, ...), a selector SEL, and a plurality of dividers DIV (DIV0, DIV1, ..., DIVn).

The preset register REG0 stores dividing ratios DR (DR0-0, DR0-1, ... DR0-$n$) respectively set for the dividers DIV0, DIV1, ... DIVn. The preset register REG1 stores dividing ratios DR (DR1-0, DR1-1, ..., DR1-$n$) respectively set for the dividers DIV0, DIV1, ... DIVn. Each preset register REG preliminarily holds the dividing ratios DR. For example, the dividing ratios DR are designed as patterns of a photomask of a metal wiring layer used to manufacture a semiconductor integrated circuit, and are set by the metal wiring. Alternatively, the dividing ratios DR are set by a controller such as a CPU during the power on sequence of a system in which a semiconductor integrated circuit is mounted. The number of dividing ratios DR held by each preset register REG corresponds to the number of dividers DIV.

The selector SEL selects a single preset register REG within the preset register group REGG corresponding to a value of a preset selection signal PSSEL, and respectively provides the dividing ratios DR stored in the selected preset register REG to the dividers DIV0-DIVn. More specifically, the selector SEL selects the dividing ratios DR output from the selected preset register REG (for example, DR0-0, DR0-1, ..., DR0-$n$), and outputs them as dividing ratios DR# (DR#-0, DR#-1, ..., DR#-n). Although there are no particular limitations thereon, the dividing ratios DR# are set in dividing ratio setting registers provided within the corresponding dividers DIV0, DIV1, ... DIVn. For example, when the preset register group REGG has eight preset registers REG, the preset selection signal PSSEL has 3 bits.

The divider DIV0 receives the dividing ratio DR#-0, divides the frequency of a clock CLK corresponding to the dividing ratio DR#-0, and outputs the clock ICLK0. The divider DIV1 divides the frequency of the clock CLK corresponding to the dividing ratio DR#-1 and outputs the clock ICLK1. The divider DIVn divides the frequency of the clock CLK corresponding to the dividing ratio DR#-n and outputs the clock ICLKn. In this manner, each divider DIV0-DIVn is able to set the dividing ratios DR#-0, DR-#1, ... DR#-n supplied from outside the dividers DIV0-DIVn via the selector SEL.

In the present embodiment, the dividing ratios DR# of the plurality of dividers DIV0-DIVn can be changed simultaneously and the frequencies of the clocks ICLK0-ICLKn can be changed simultaneously in response to the preset selection signal PSSEL. Since switching of the frequencies of the plurality of clocks ICLK can be completed in a short period of time, the amount of time during which the frequencies of the clocks ICLK are not determined (namely, the amount of time during which circuit blocks are unable to operate) can be minimized in a plurality of circuit blocks.

For example, the frequencies of all clocks ICLK used in a semiconductor integrated circuit can be set simultaneously simply by carrying out a selection operation of the selector SEL with the preset selection signal PSSEL during the power on sequence of a semiconductor integrated circuit in which the clock divider circuit CDC is mounted. Alternatively, the frequencies of all clocks ICLK used in a semiconductor integrated circuit can be switched simultaneously simply by carrying out a selection operation of the selector SEL during switching of an operating mode of a semiconductor integrated circuit in which the clock divider circuit CDC is mounted. Although there are no particular limitations thereon, the frequencies of all clocks ICLK used in a semiconductor integrated circuit can be switched simultaneously by providing a preset selection register that sets a logical value of the preset selection signal PSSEL and rewriting the preset selection register once.

As has been described above, in this embodiment, the frequencies of a plurality of clocks ICLK can be switched simultaneously by a selection operation of the selector SEL. As a result, operating efficiency of a plurality of circuit blocks supplied by the clocks ICLK having mutually different frequencies can be improved, and performance of a semiconductor integrated circuit in which the clock divider circuit CDC is mounted and system with such semiconductor integrated circuit can be improved.

Figure 2:
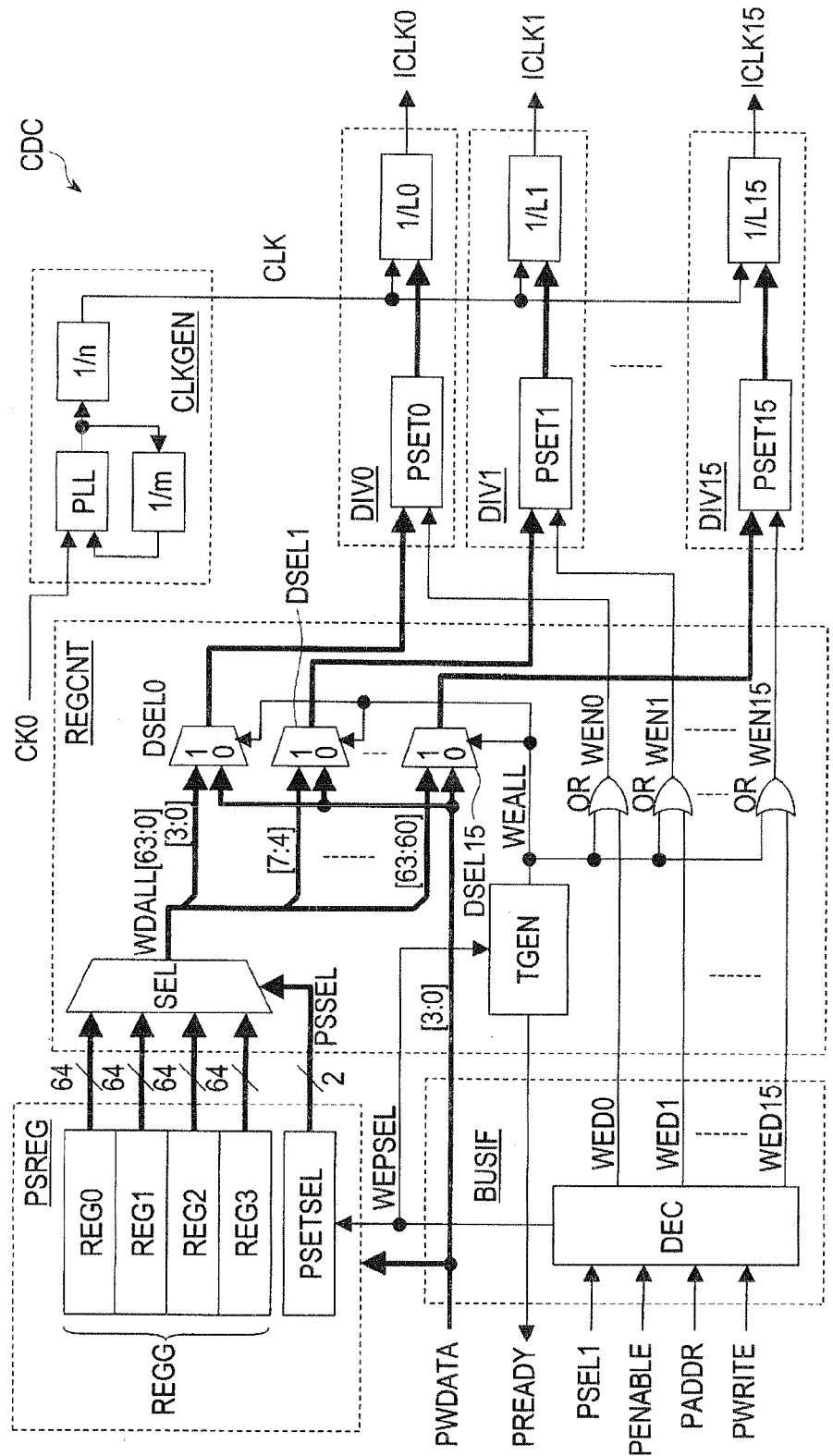
FIG. 2 is a drawing of the clock divider circuit CDC in another embodiment.

FIG. 2 is a drawing of the clock divider circuit CDC in another embodiment. Those elements that are identical to the elements explained in the previous embodiment are indicated with the same reference symbols and detailed explanations thereof are omitted. For example, the clock divider circuit CDC is mounted in a semiconductor integrated circuit along with a plurality of circuit blocks (not shown) that operate synchronously to the plurality of clocks ICLK (ICLK0, ICLK1, . . . , ICLK15) having different frequencies.

The clock divider circuit CDC has a preset register unit PSREG, a register control circuit REGCNT, a clock generation circuit CLKGEN, 16 dividers DIV0-DIV15, and a bus interface BUSIF. For example, the dividing ratios of each divider DIV0-15 can be set in 16 ways according to a 4-bit setting signal PSET (any of PSET0-PSET15).

The preset register unit PSREG has the preset register group REGG containing four preset registers REG0-REG3, and a preset selection register PSETSEL that outputs the preset selection signal PSSEL. Each preset register REG0-3 has 64 bits (4 bits×16 dividers) for storing the dividing ratios of the 16 dividers DIV0-15. The dividing ratio stored in each of the preset registers REG0-3 is designed as a pattern of a photomask of a metal wiring layer used to manufacture a semiconductor integrated circuit, and is set by the metal wiring in the same manner as the previously described embodiment. Alternatively, the dividing ratios are set by a controller such as a CPU during the power on sequence of a system in which a semiconductor integrated circuit is mounted.

The preset selection register PSSETSEL has a storage region of 2 bits corresponding to each bit of the 2-bit preset selection signal PSSEL. The write data PWDATA supplied along with a preset write enable signal WEPSEL is set to the preset selection register PSETSEL. The preset write enable signal WEPSEL is generated when the frequencies of the clock signals ICLK0-15 are initially set or changed.

The bus interface BUSIF has a decoder DEC for generating the preset write enable signal WEPSEL and divider write enable signals WED0-15. The decoder DEC operates during assertion of a selection signal PSEL1 for the clock divider circuit CDC. The decoder DEC decodes an address signal PADDR in response to an enable signal PENABLE when the selection signal PSEL1 and a write control signal PWRITE are asserted, and sets the preset write enable signal WEPSEL or the divider write enable signals WED0-15 to a high level for a prescribed period.

The register control circuit REGCNT has the selector SEL, 16 data selection circuits DSEL (DSEL0-15), a timing generation circuit TGEN and 16 OR circuits. The selector SEL selects any of the preset registers REG0-3 according to the 2-bit preset selection signal PSSEL, and outputs a value stored in the selected preset register REG as 64-bit write data WDALL.

Each data selection circuit DSEL selects the corresponding 4 bits of the write data WDALL when an all write enable signal WEALL is at a high level, and selects 4 bits of the write data PWDATA when the all write enable signal WEALL is at a low level. Each data selection circuit DSEL outputs the selected 4 bits of data to the corresponding divider DIV (DIV0-15). The write data WDALL is dividing ratio data of any of the preset registers REG0-4, while the write data PWDATA is dividing ratio data supplied from outside the clock divider circuit CDC, such as a CPU.

The timing generation circuit TGEN asserts the all write enable signal WEALL to a high level for a prescribed period in response to the preset write enable signal WEPSEL. In addition, when the bus interface BUSIF receives the next write request during the time the all write enable signal WEALL is asserted and dividing ratios are written to the dividing ratio setting registers PSET (PSET0-PSET15), the timing generation circuit TGEN asserts a wait request signal PREADY to a low level for a prescribed period and holds the next write request. A detailed description of this wait request signal PREADY will be subsequently provided. The OR circuits output the all write enable signal WEALL or write enable signals WED0-15 to the dividers DIV0-DIV15 as write enable signals WEN0-15.

The clock generation circuit CLKGEN has a PLL circuit and divider circuits 1/n and 1/m, and for example, reforms a waveform of a reference clock CK0 and outputs the reformed clock as the clock CLK. Each of the dividers DIV0-DIV15 has a dividing ratio setting register PSET (PSET0-PSET15) and divider circuits 1/L (1/L0-1/L15). Furthermore, the clock generation circuit CLKGEN may also be formed outside the clock divider circuit CDC.

Each of the dividing ratio setting registers PSET stores a 4-bit value (indicating the dividing ratio) output from the data selection circuits DSEL in response to the write enable signals WEN (any of WEN0-15). Each of the divider circuits 1/L divides the frequency of the clock CLK corresponding to the dividing ratio stored in the corresponding dividing ratio setting register PSET, to generate a clock signal ICLK (any of the ICLK0-15).

Figure 3:
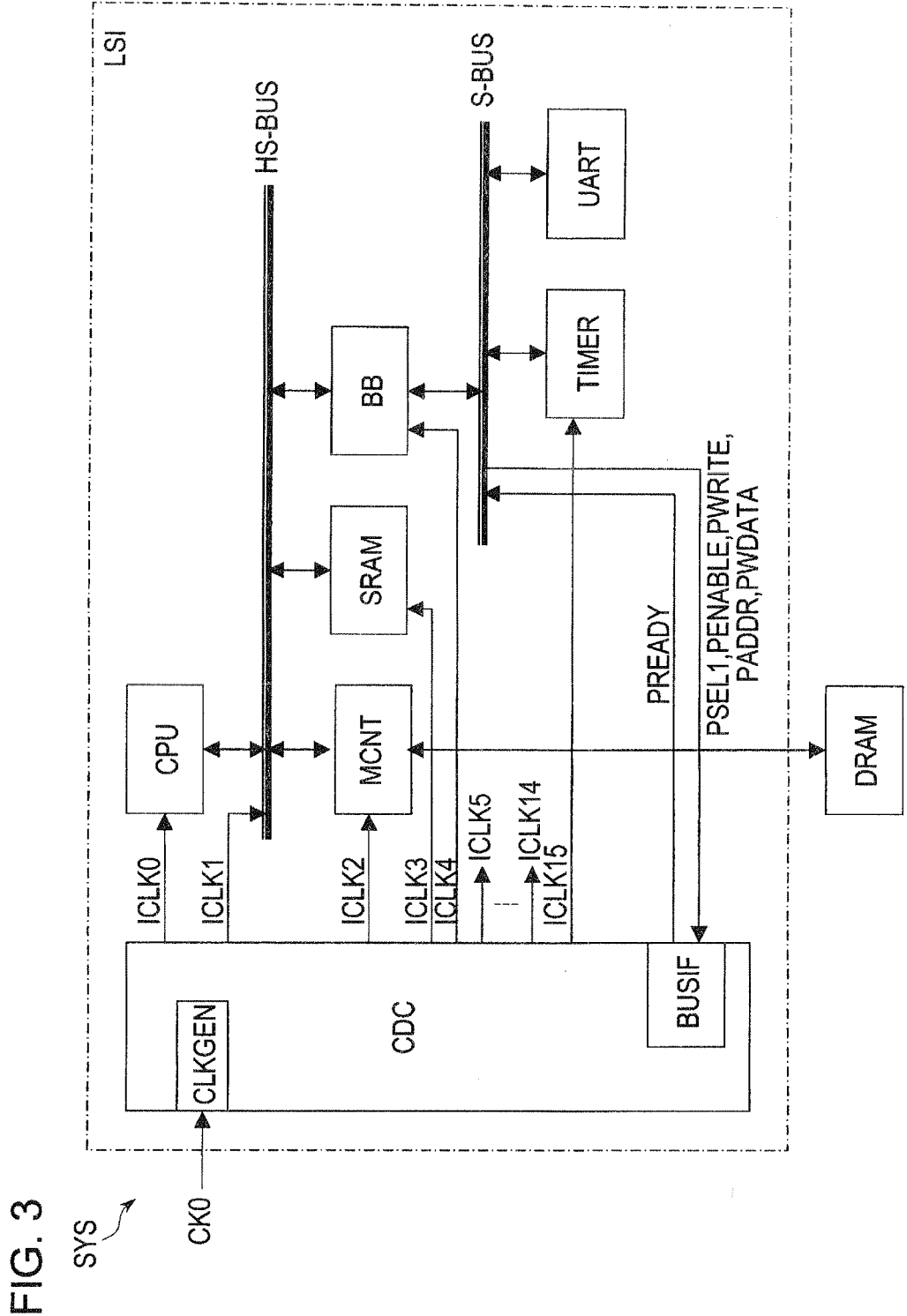
FIG. 3 is a drawing of a system LSISYS having the clock divider circuit CDC shown in FIG. 2.

FIG. 3 is a drawing of a system LSI SYS having the clock divider circuit CDC shown in FIG. 2. For example, the system SYS has a semiconductor integrated circuit LSI in which the clock divider circuit CDC is mounted and a DRAM. The semiconductor integrated circuit LSI has a CPU, a memory controller MCNT and an SRAM connected to a high-speed bus HS-BUS, a timer TIMER, a universal asynchronous receiver/transmitter UART and the clock divider circuit CDC connected to a low-speed S-BUS, and a bus bridge BB that connects the high-speed bus HS-BUS and the low-speed bus S-BUS. For example, the high-speed bus HS-BUS and the low-speed bus S-BUS are AHB and APB, respectively, as proposed by ARM Limited, while the bus bridge BB is an AHB-APB bus bridge. The CPU, the memory controller MCNT, the timer TIMER and the like are external circuits of the clock divider circuit CDC.

The write enable signal PWRITE, the address signal PADDR and the write data PWDATA are supplied from the CPU via the high-speed bus HS-BUS, the bus bridge BB, and the low-speed bus S-BUS. The wait request signal PREADY is supplied to the CPU via the low-speed bus S-BUS, the bus bridge BB and the high-speed bus HS-BUS. The reference clock CK0 is supplied from outside the semiconductor integrated circuit LSI. In this example, the clock ICLK0 is supplied to the CPU, while the clock ICLK1 is supplied to the high-speed bus HS-BUS. The clock ICLK2 is supplied to the memory controller MCNT, while the clock ICLK3 is supplied to the SRAM. The clock ICLK4 is supplied to the bus bridge BB, while the clock ICLK15 is supplied to the timer TIMER. The clocks ICLK5-ICLK14 are supplied to other circuit blocks.

Figure 4:
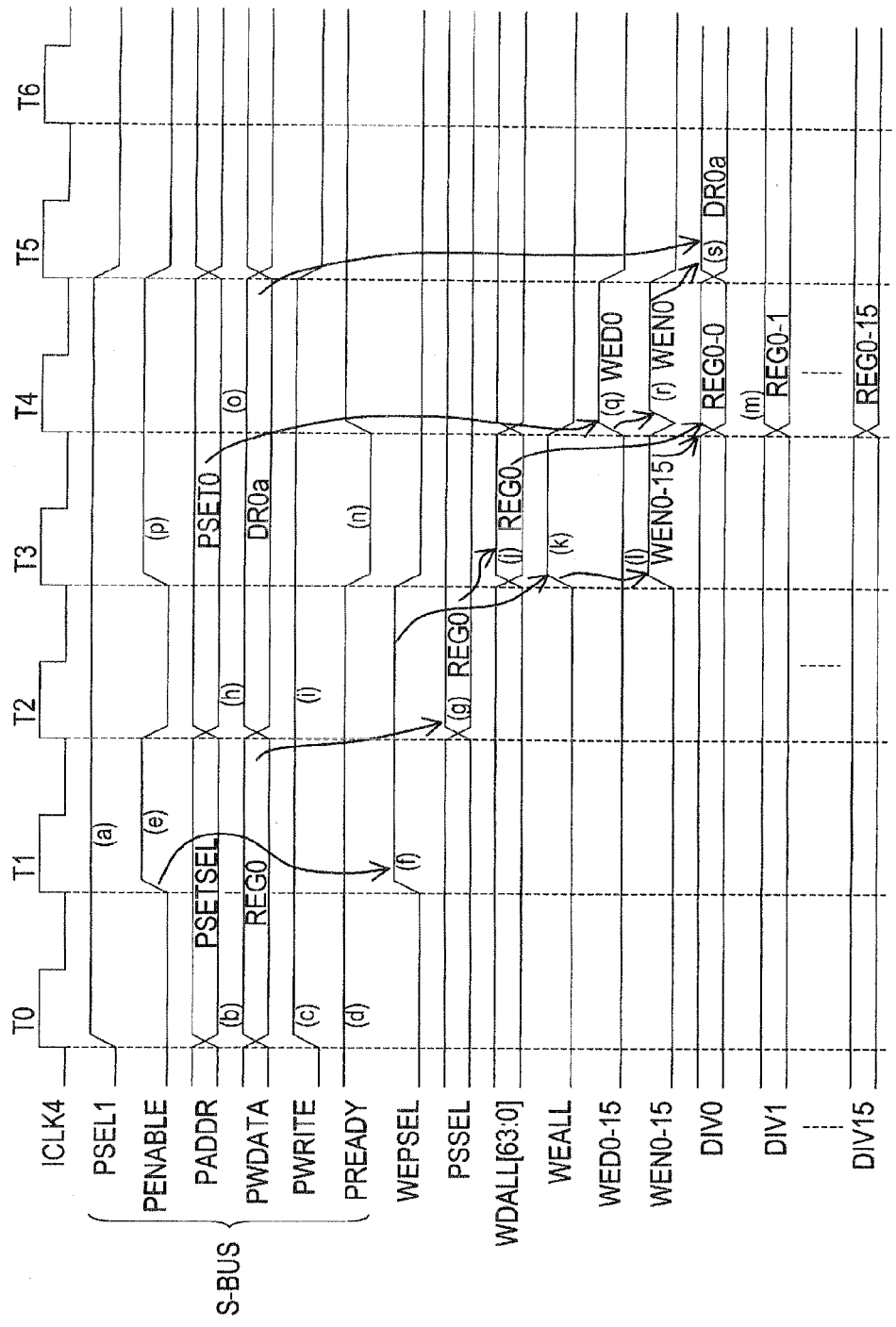
FIG. 4 is a sequence diagram of the clock divider circuit CDC shown in FIG. 2.

FIG. 4 is a sequence diagram of the clock divider circuit CDC shown in FIG. 2. In this example, frequencies of the clock signals ICLK0-15 respectively generated by the dividers DIV0-4 are simultaneously switched by changing an operating mode of the system SYS, while frequencies of any of the clock signals ICLK0-4 are switched independently. A single access to the clock divider circuit CDC by the CPU requires two clock cycles of the clock ICLK4 supplied to the bus bridge BB. In the operation example of FIG. 4, since the clock divider circuit CDC is write-accessed twice by the CPU, the bus bridge BB asserts the selection signal PSEL1 to a high level during four clock cycles. However, in the operation example of FIG. 4, since a wait cycle is inserted by asserting the wait request signal PREADY in a clock cycle T3, the selection signal PSEL1 is asserted during a total of five clock cycles consisting of clock cycles T0-T4 ((a) in FIG. 4).

During the initial write access, the CPU writes the preset selection signal PSSEL value to the preset selection register PSETSEL. As a result, dividing ratios of the preset registers REG0-4 selected by the preset selection signal PSSEL are set in the dividing ratio setting registers PSET0-15 within the dividers. During the clock cycles T0-T1, the CPU outputs address signal PADDR (PSREG) indicating the preset selection register PSETSEL and the write data PWDATA (REG0) indicating selection of the preset register REG0 via the bus bridge BB ((b) in FIG. 4). In addition, the CPU asserts the write control signal PWRITE to a high level via the bus bridge BB ((c) in FIG. 4). The selection signal PSEL1, the address signal PADDR (PSREG) and the write control signal PWRITE are request signals that select any of the preset registers REG0-3 from a circuit outside the clock divider circuit CDC such as the CPU. The timing generation circuit TGEN of the clock divider circuit CDC holds the wait request signal PREADY at a high level (negate level) during standby when write access is not carried out ((d) in FIG. 4). During the time the wait request signal PREADY is at the negate level, the clock divider circuit CDC is able to accept write access from the CPU.

During the clock cycle T1, the bus bridge BB asserts the enable signal PENABLE to a high level for a period of one clock cycle based on control from the CPU ((e) in FIG. 4). The decoder DEC of the clock divider circuit CDC confirms write requests in response to assertion of the enable signal PENABLE.

During the clock cycle T1, since the address signal PADDR indicates the preset selection register PSETSEL, the decoder DEC asserts the preset write enable signal WEPSEL to a high level for two clock cycles ((f) in FIG. 4). The preset selection register PSETSEL of the preset register unit PSREG receives the write data signal PWDATA (REG0) during assertion of the write enable signal WEPSEL, and outputs the preset selection signal PSSEL (REG0) for selecting the preset register REG0 ((g) in FIG. 4). In the operation example of FIG. 4, the preset selection signal PSSEL is a signal that selects the preset register REG0.

On the other hand, during the second write access, the CPU directly sets a dividing ratio of the divider DIV0. Namely, during the clock cycles T2-T3, the CPU accesses the clock divider circuit CDC in order to change the dividing ratio of the divider DIV0 only. More specifically, the CPU outputs the address signal PADDR (PSET0) indicating the address of the dividing ratio setting register PSET0 of the divider DIV0 and the write data PWDATA (DR0a) indicating a prescribed dividing ratio DR0a via the bus bridge BB ((h) in FIG. 4). At this time, the CPU continues to assert the write enable signal PWRITE via the bus bridge BB ((i) in FIG. 4). In other words, the selection signal PSEL1, the address signal PADDR (PSET0) and the write control signal PWRITE are write requests for dividing ratios to any of the dividing ratio setting registers PSET0-15 from a circuit outside the clock divider circuit CDC such as the CPU.

During the clock cycle T3, the selector SEL of the clock divider circuit CDC receives 64-bit data indicating a dividing ratio from the selected preset register REG0 corresponding to the initial write access, and outputs the write data WDALL (REG0) ((j) in FIG. 4). The timing generation circuit TGEN of the clock divider circuit CDC asserts the all write enable signal WEALL to a high level in response to the preset write enable signal WEPSEL ((k) in FIG. 4).

The data selection circuits DSEL0-15 of the clock divider circuit CDC output each 4 bit of the write data WDALL (REG0) to the dividers DIV0-DIV15 during assertion of the all write enable signal WEALL. The OR circuits assert all of the write enable signals WEN0-15 in response to the all write enable signal WEALL ((l) in FIG. 4). The write data WDALL (REG0-0, REG0-1, ..., REG0-15) is written all at once to the dividing ratio setting registers PSET0-PSET15 of the dividers DIV0-DIV15. The dividing ratios of the dividers DIV0-DIV15 are determined synchronously to the rising edge of the clock signal ICLK4 of the clock cycle T4 during which the write enable signals WEN0-15 are at a high level ((m) in FIG. 4). As a result, each of the dividers DIV1-DIV15 switches the frequencies of the clock signals ICLK0-15 all at once.

Furthermore, when switching the dividing ratios of all of the dividers DIV0-DIV15 with the preset register unit PSREG, the number of logical gates of the data path is increased by the selector SEL and the data selection circuits DSEL (DESL0-15). Consequently, operational timing is actually improved by receiving an output signal from the selector SEL with a flip-flop. For example, flip-flops are provided in output terminals of the selector SEL of FIG. 2 that latch the output signals synchronously to a clock. Consequently, the write data WDALL is output from the selector SEL during the next clock cycle T3 in response to "REG0" of the preset selection signal PSSEL of the clock cycle T2. As a result, the clock cycle is delayed by one clock cycle in comparison with the operation of switching any of the frequencies of each of the dividers DIV0-DIV15 independently using the write enable signals WED0-15. Thus, it is required to prevent misoperations when a write access is made to any of the dividing ratio setting registers PSET0-15, during setting of the dividing ratios by the preset register unit PSREG. Consequently, the timing generation circuit TGEN asserts the wait request signal PREADY (L level) during the next clock cycle (T3 in this example) when the preset write enable signal WEPSEL is received ((n) in FIG. 4). After having received assertion of the wait request signal PREADY, the CPU extends the output periods of the address signal PADDR and the write data PWDATA by one clock cycle ((o) in FIG. 4).

During the clock cycle T3, the bus bridge BB asserts the enable signal PENABLE based on control from the CPU in corresponding to a second write access ((p) in FIG. 4). Furthermore, the assertion period of the enable signal PENABLE is extended by one clock cycle by assertion of the wait request signal PREADY. The decoder DEC recognizes a write request in response to the enable signal PENABLE being at a high level.

During the clock cycle T4, since the address signal PADDR indicates the dividing ratio setting register PSET0, the decoder DEC asserts the write enable signal WED0 to a high level for one clock cycle ((q) in FIG. 4). As a result, the write enable signal WEN0 is asserted to a high level ((r) in FIG. 4). The write data PWDATA indicating the dividing ratio DR0a is written to the dividing ratio setting register PSET0 of the dividing DIV0 in response to the write enable signal WEN0. The dividing ratio of the divider DIV0 is determined synchronously to the rising edge of the write enable signal WEN0 ((s) in FIG. 4). As a result, only the dividing ratio of the divider DIV0 among the 16 dividers DIV0-15 is rewritten, and the frequency of the clock signal ICLK0 is switched.

As has been described above, effects similar to those of the previously described embodiment can be obtained in this embodiment as well. Moreover, by providing the preset selection register PSETSEL that stores values indicating the selected preset registers REG0-3 in the preset register unit PSREG, dividing ratios of the dividers DIV0-15 can be switched simultaneously by the write data signal PWDATA having fewer bits (2 bits in the example of (a)-(s) FIG. 4) than 64-bit dividing ratio data. In addition, the dividing ratio of each divider DIV0-15 can be changed separately with the data selectors DSEL0-15 and the OR circuits. For example, in a certain operating mode of the system SYS, when it is necessary to frequently switch only the frequencies of the clocks ICLK supplied to a single circuit block, the frequencies of the clocks ICLK can be switched efficiently without increasing the number of preset registers REG0-3. As a result, the operating efficiencies of a plurality of circuit blocks supplied with the clocks ICLK having mutually different frequencies can be improved, and performance of the semiconductor integrated circuit and system in which the clock divider circuit CDC is mounted can be improved.

Figure 5:
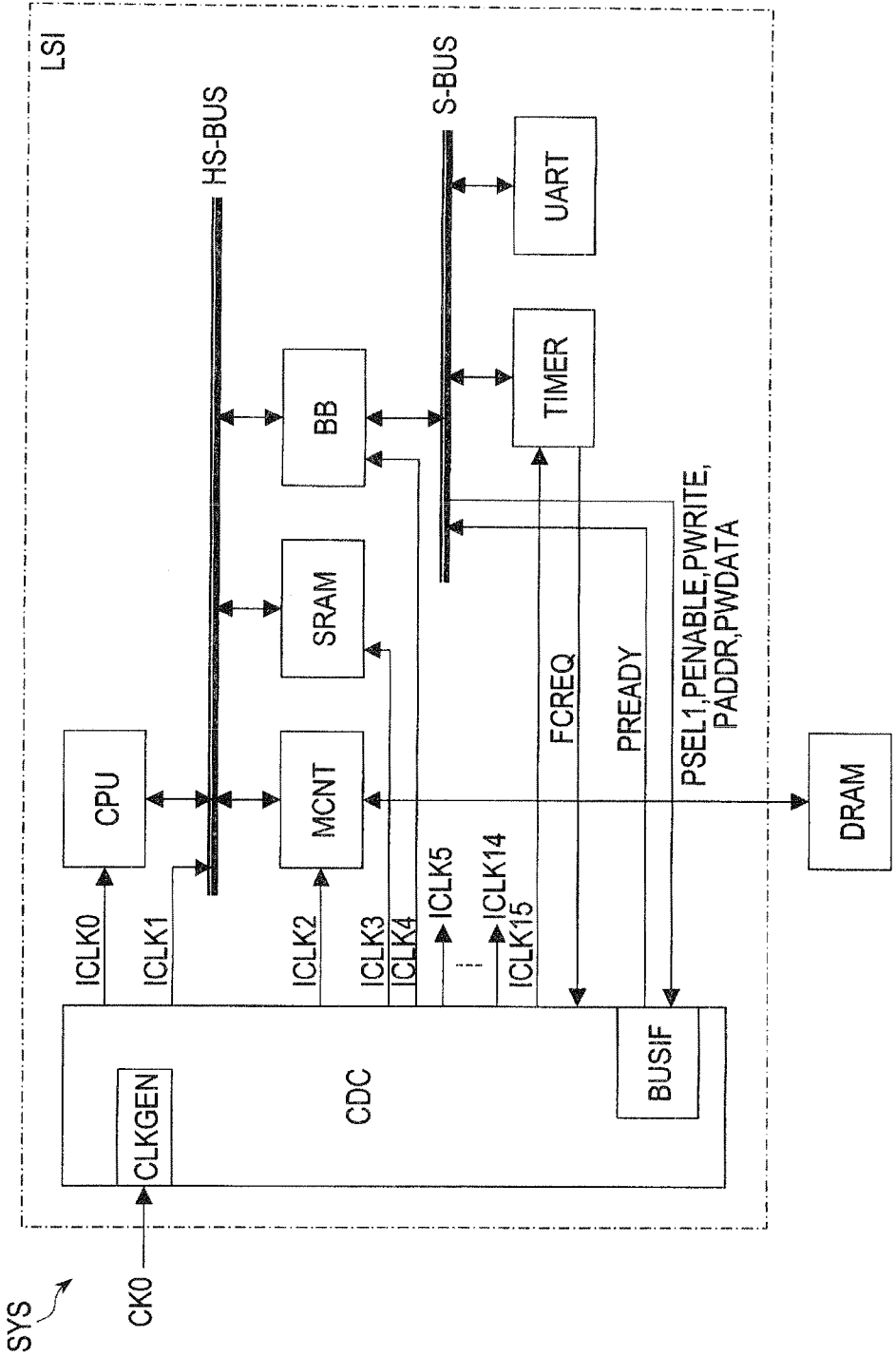
FIG. 5 is a drawing of the system LSISYS having the clock divider circuit CDC in another embodiment.

FIG. 5 is a drawing of the system LSI SYS having the clock divider circuit CDC in another embodiment. Those elements that are identical to the elements explained in the previous embodiments are indicated with the same reference symbols and detailed explanations thereof are omitted. In this embodiment, a frequency change request FCREQ is output to the clock divider circuit CDC from the timer TIMER. For example, the timer TIMER measures a prescribed time using a down counter, and asserts the frequency change request FCREQ when the counter value has reached zero. After having received the frequency change request FCREQ, the clock divider circuit CDC switches the frequencies of the clocks ICLK0-15 to certain values. For example, an operating mode of the system SYS can be allowed to enter a low power mode by switching the frequencies of the clocks ICLK0-15 based on the frequency change request FCREQ from the timer TIMER. Other constituents of the system SYS are the same as shown in FIG. 3 with the exception of having a different clock divider circuit CDC.

Figure 6:
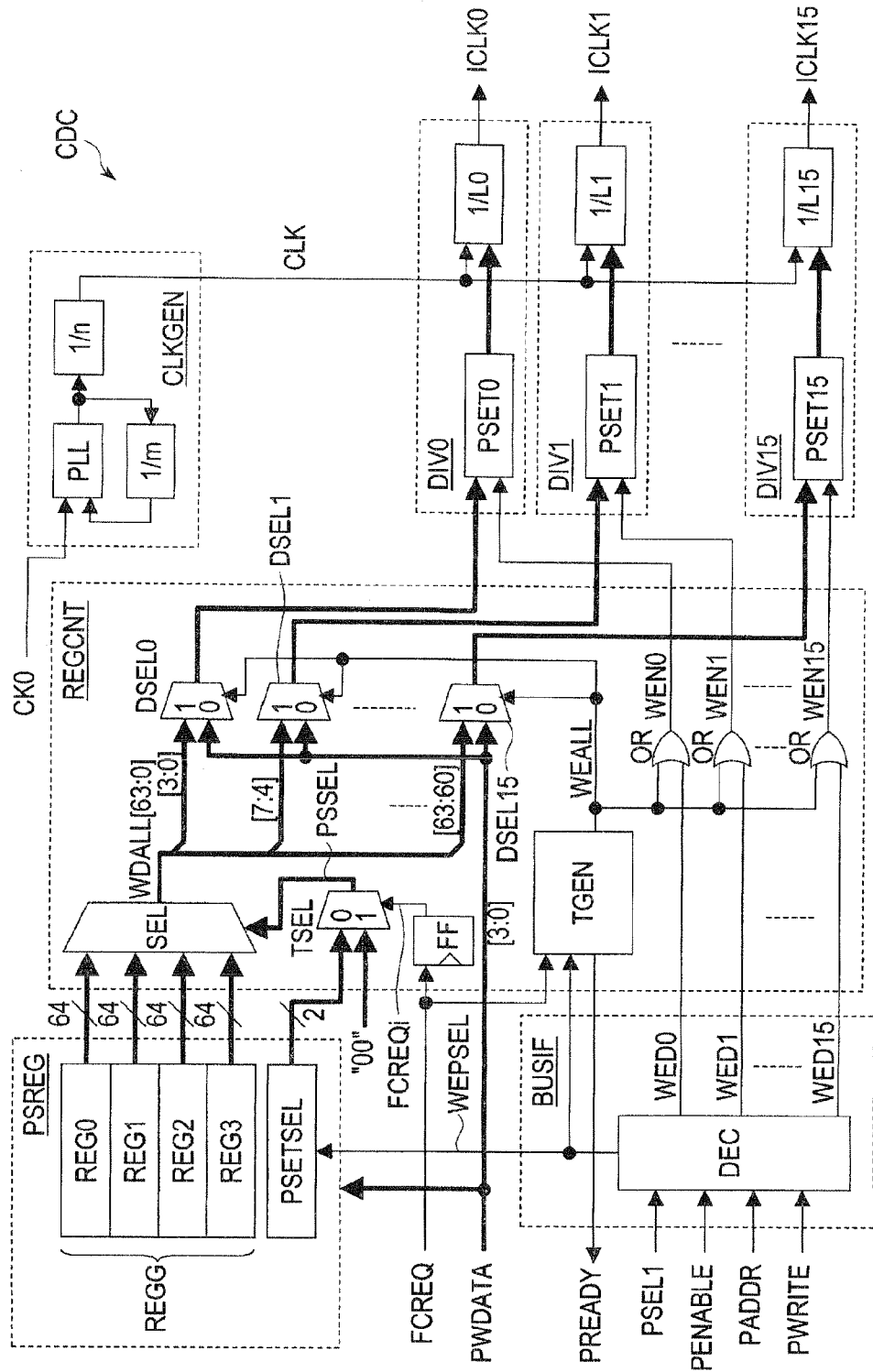
FIG. 6 is a drawing of the clock divider circuit CDC shown in FIG. 5.

FIG. 6 is a drawing of the clock divider circuit CDC shown in FIG. 5. In this clock divider circuit CDC, a flip-flop FF and a selector TSEL are added to the clock divider circuit CDC shown in FIG. 2. Other constituents of the clock divider circuit CDC are the same as shown in FIG. 2.

The flip-flop FF, for example, receives the frequency change request FCREQ in synchronization with the clock ICLK4, and outputs as a frequency change request FCREQi. When the frequency change request FCREQi is negated to a low level, the selector TSEL outputs the output of the preset selection register PSETSEL as the preset selection signal PSSEL. When the frequency change request FCREQi has been asserted to a high level, the selector TSEL outputs a binary fixed value "00" as the preset selection signal PSSEL. The fixed value "00" is a preset selection signal that selects the preset register REG0. Furthermore, the fixed value supplied to the selector TSEL may be set to any of binary numbers "01", "10" or "11" in order to select any of the other preset registers REG1-3.

In addition, the timing generation circuit TGEN has a circuit that generates OR logic of the preset write enable signal WEPSEL and the frequency change request FCREQ. The timing generation circuit TGEN sets the all write enable signal WEALL to a high level for a prescribed period in response to the preset write enable signal WEPSEL or the frequency change request FCREQ. Other constituents and operations of the timing generation circuit TGEN are the same as shown in FIG. 2 and FIG. 4A to FIG. 4S.

Figure 7:
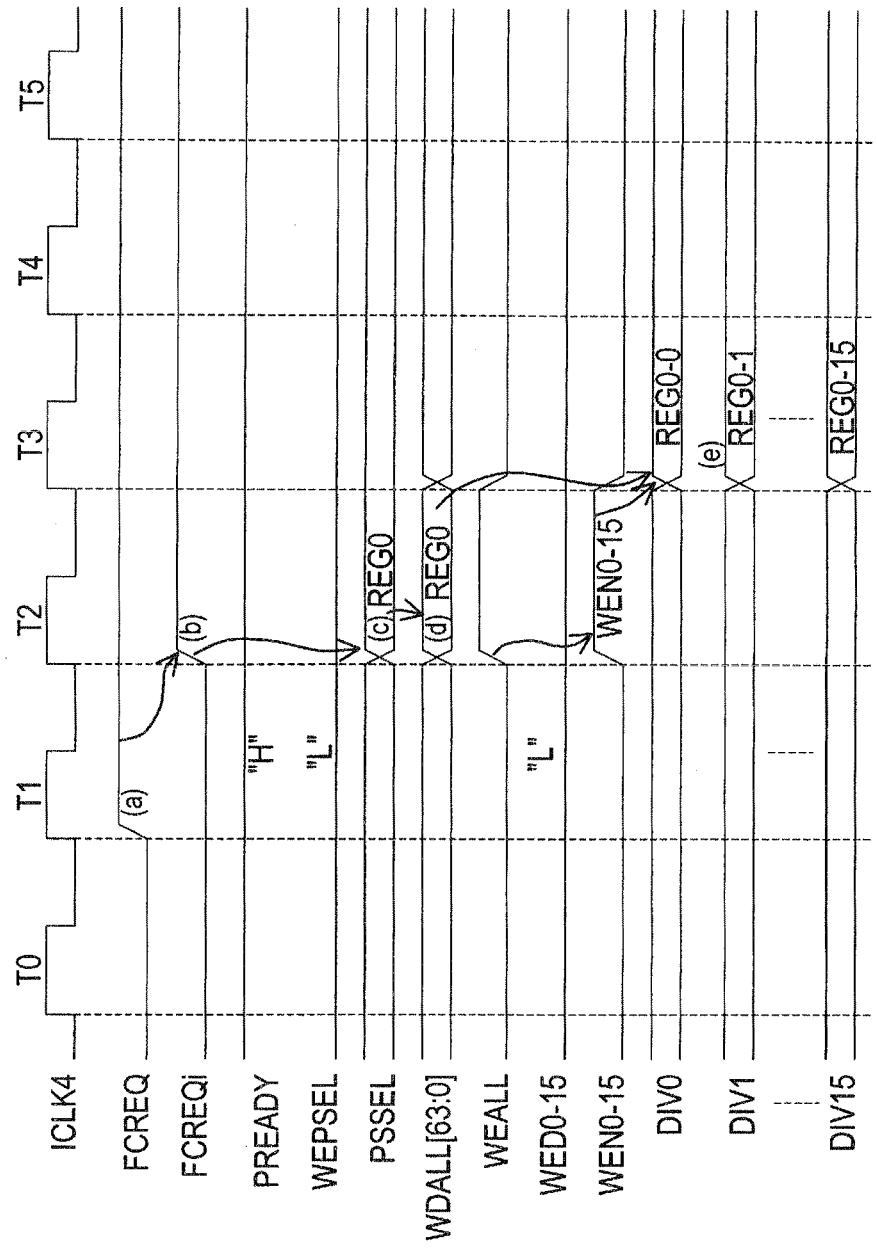
FIG. 7 is a sequence diagram of the clock divider circuit shown in FIG. 5.

FIG. 7 is a sequence diagram of the clock divider circuit shown in FIG. 5. Since operation is the same as that shown in FIG. 4, a detailed explanation thereof is omitted. In this example, dividing ratios of the divider circuit are rewritten and frequencies of the clocks ICLK0-15 generated by the divider circuit are switched in response to the frequency change request FCREQ supplied from the timer TIMER instead of the CPU.

For example, the timer TIMER asserts the frequency change request FCREQ when a counter value reaches zero during the clock cycle T1 ((a) in FIG. 7). The flip-flip FF shown in FIG. 6 receives the frequency change request FCREQ during the next clock cycle T2, and asserts the frequency change request FCREQi ((b) in FIG. 7).

The selector TSEL receives the frequency change request FCREQ asserted to a high level, and outputs the binary fixed value "00" as the preset selection signal PSSEL ((c) in FIG. 7). As a result, similar to FIG. 4, the write data WDALL (REG0) held in the preset register REG0 is output ((d) in FIG. 7), and each 4 bit of the write data WDALL (REG0) is supplied to the dividers DIV0-DIV15 synchronously to the all write enable signal WEALL ((e) in FIG. 7). The frequencies of the clock signals ICLK0-15 generated by each divider DIV0-DIV15 are then switched in response to the frequency change request FCREQ from the timer TIMER.

As has been described above, effects similar to those of the previously described embodiments can be obtained in this embodiment as well. Moreover, the frequencies of the clock signals ICLK0-15 can be switched without control from the CPU since the dividing ratios of the dividers DIV0-15 are switched corresponding to a frequency change request FCREQ from a module within the system SYS such as the timer TIMER. Furthermore, in the operation example shown in FIG. 7, the selector SEL outputs the write data WDALL during the clock cycle T2. However, the selector SEL may also output the write data WDALL by delaying by one clock cycle in the same manner as in FIG. 4.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock divider circuit, comprising:
   a plurality of dividers each having a dividing ratio setting register in which a dividing ratio is settable, and each dividing an input clock according to the dividing ratio set in the dividing ratio setting register;
   a preset register group having a plurality of preset registers each of which stores the dividing ratios being set for the dividing ratio setting registers of the plurality of dividers; and
   a selector that selects a single preset register within the preset register group, and provides the dividing ratios stored in the selected preset register to the dividing ratio setting registers of the plurality of dividers, wherein
   each of the dividing ratio setting registers is configured to be able to be set with a dividing ratio supplied from an external circuit.

2. The clock divider circuit according to claim 1, wherein the preset registers store the dividing ratios corresponding to each of the dividing ratio setting registers, and
   the dividing ratios held in the preset registers are supplied to the corresponding dividing ratio setting registers via the selector.

3. The clock divider circuit according to claim 1, further comprising:
   a decoder that decodes a first request that requests writing of the dividing ratios to the dividing ratio setting registers from the external circuit, and a second request that requests selection of the preset register from the external circuit; and
   a control circuit that accesses the dividing ratio setting registers in a case of the first request, or selects one of the preset registers by controlling the selector in a case of the second request, corresponding to an output of the decoder.

4. The clock divider circuit according to claim 3, wherein the control circuit further controls the selector without going through the decoder when the second request is received from another external circuit.

5. The clock divider circuit according to claim 1, further comprising:
   a preset selection register that stores a preset selection value indicating one of the preset registers selected by the selector, and wherein
   in response to the preset selection value having been written to the preset selection register, the selector selects one of the preset registers corresponding to the preset selection value, and the dividing ratios of the plurality of dividers are set all at once to the dividing ratios of the selected preset register.

6. A clock divider circuit, comprising:
   a plurality of dividers for which dividing ratios are settable;
   a plurality of preset registers each storing dividing ratios being set for the plurality of dividers;
   a selector that selects any of the plurality of preset registers, and outputs the dividing ratios stored in the selected preset register to the plurality of dividers; and
   a control circuit configured to, in response to a first request signal, which requests selection of a preset register, have the selector select the preset register being selected by the first request signal among the plurality of preset registers so as to set the dividing ratios stored in the selected preset register to the plurality of dividers and in response to a second request signal that requests setting a dividing ratio to an individual divider among the plurality of dividers, set a dividing ratio supplied with the second request signal to a divider specified by the second request signal.

7. The clock divider circuit according to claim 6, wherein the control circuit is configured to have the selector select a certain preset register among the plurality of preset registers, in response to a third request signal that requests setting of the dividing ratios of the certain preset register to the plurality of dividers.

8. A system LSI, comprising:
   a CPU;
   a plurality of internal circuits; and
   a clock divider circuit that divides an input clock and outputs the divided clock to the CPU and the plurality of internal circuits, wherein
   the clock divider circuit comprises:
   a plurality of dividers, for which dividing ratios are settable, that divide the input clock corresponding to the dividing ratios and respectively output the divided clock to the plurality of internal circuits,
   a plurality of preset registers each storing dividing ratios being set in the plurality of dividers,
   a selector that selects any of the plurality of preset registers, and outputs the dividing ratios stored in the selected preset register to the plurality of dividers, and
   a control circuit configured to, in response to a first request signal, which is supplied from the CPU and requests selection of a preset register, have the selector select the preset register being selected by the first request signal among the plurality of preset registers so as to set the dividing ratios stored in the selected preset register to the plurality of dividers, and in response to a second request signal that is supplied from the CPU and requests setting a dividing ratio to an individual divider among the plurality of dividers, set a dividing ratio supplied with the second request signal to a divider specified by the second request signal.

9. The system LSI according to claim 8, wherein the control circuit is configured to have the selector select a certain preset register among the plurality of preset registers, in response to a third request signal that is supplied from the internal circuits and requests setting of the dividing ratios of the certain preset register to the plurality of dividers.

* * * * *